(12) United States Patent
Eckert et al.

(10) Patent No.: US 10,640,000 B2
(45) Date of Patent: May 5, 2020

(54) METHOD AND DEVICE FOR DETECTING A DIRECT-CURRENT FAULT CURRENT

(71) Applicant: Robert Bosch GmbH, Stuttgart (DE)

(72) Inventors: Bernd Eckert, Vaihingen an der Enz (DE); Steffen Eppler, Ludwigsburg (DE)

(73) Assignee: Robert Bosch GmbH, Stuttgart (DE)

( * ) Notice: Subject to any disclaimer, the term of this patent is extended or adjusted under 35 U.S.C. 154(b) by 598 days.

(21) Appl. No.: 15/509,347

(22) PCT Filed: Jul. 2, 2015

(86) PCT No.: PCT/EP2015/065133
§ 371 (c)(1),
(2) Date: Mar. 7, 2017

(87) PCT Pub. No.: WO2016/037721
PCT Pub. Date: Mar. 17, 2016

(65) Prior Publication Data
US 2017/0259669 A1    Sep. 14, 2017

(30) Foreign Application Priority Data

Sep. 8, 2014   (DE) .................. 10 2014 217 928

(51) Int. Cl.
*B60L 3/00*        (2019.01)
*H02H 3/16*        (2006.01)
(Continued)

(52) U.S. Cl.
CPC .............. *B60L 3/0069* (2013.01); *B60L 3/00* (2013.01); *B60L 3/04* (2013.01); *B60L 53/14* (2019.02);
(Continued)

(58) Field of Classification Search
CPC .. B60L 3/0069; B60L 3/00; B60L 3/04; B60L 3/162; B60L 3/167; B60L 3/332;
(Continued)

(56) References Cited

U.S. PATENT DOCUMENTS

2014/0021921 A1*  1/2014  Thommes ............. B60L 3/0069
320/109

FOREIGN PATENT DOCUMENTS

CN         1551442 A      12/2004
DE       102011016539      10/2012
(Continued)

OTHER PUBLICATIONS

Machine Translation of DE102013200803, 14 pages (Year: 2014).*
(Continued)

*Primary Examiner* — Nathaniel R Pelton
(74) *Attorney, Agent, or Firm* — Michael Best & Friedrich LLP

(57) ABSTRACT

The invention relates to a method for detecting a direct-current fault current in an electrical alternating-current circuit, wherein a rectifier unit (14) is connected to an alternating-current network (34) by means of a primary side (13) and provides a direct current on a secondary side (15) and wherein the alternating-current network (34) is protected by means of a fault-current circuit breaker (38), which interrupts the circuit if an alternating-current fault current greater than a specified alternating-current tripping threshold occurs. A direct-current fault current on the primary side (13) is measured and is compared with a specified direct-current tripping threshold. An alternating-current fault current is produced if the direct-current fault current lies above the tripping threshold. The invention further relates to a device (10) for detecting a direct-current fault current and to a charging apparatus (12) comprising such a device (10).

7 Claims, 1 Drawing Sheet

(51) Int. Cl.
*H02H 3/33* (2006.01)
*B60L 3/04* (2006.01)
*B60L 53/22* (2019.01)
*B60L 53/14* (2019.01)
*G01R 31/50* (2020.01)

(52) U.S. Cl.
CPC .............. *B60L 53/22* (2019.02); *G01R 31/50* (2020.01); *H02H 3/162* (2013.01); *H02H 3/167* (2013.01); *H02H 3/332* (2013.01); *H02H 3/334* (2013.01); *B60L 2210/30* (2013.01); *Y02T 10/7005* (2013.01); *Y02T 10/7072* (2013.01); *Y02T 10/7241* (2013.01); *Y02T 90/127* (2013.01); *Y02T 90/14* (2013.01)

(58) Field of Classification Search
CPC .......... B60L 3/334; B60L 53/22; B60L 53/14; G01R 31/025; H02H 3/162; H02H 3/167; H02H 3/332; H02H 3/334

USPC ........................................................ 320/109
See application file for complete search history.

(56) References Cited

FOREIGN PATENT DOCUMENTS

| | | |
|---|---|---|
| DE | 102013200803 | 8/2014 |
| EP | 0866536 | 9/1998 |

OTHER PUBLICATIONS

International Search Report for Application No. PCT/EP2015/065133 dated Sep. 2, 2015 (English Translation, 2 pages).

\* cited by examiner

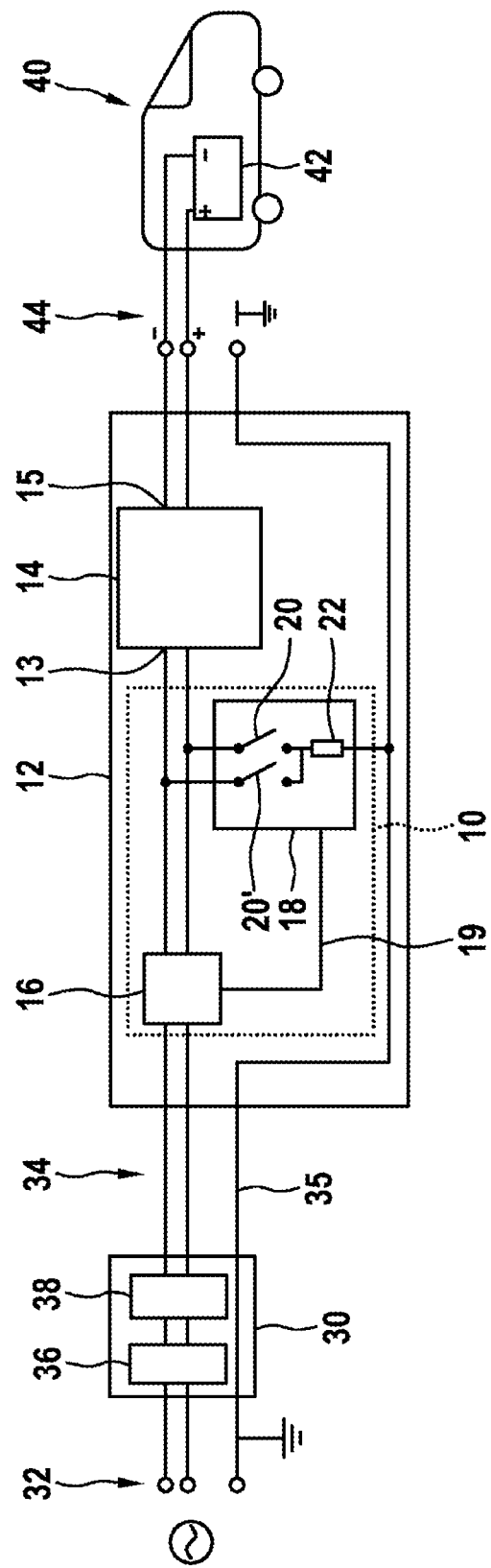

METHOD AND DEVICE FOR DETECTING A DIRECT-CURRENT FAULT CURRENT

BACKGROUND OF THE INVENTION

The invention relates to a method for detecting a d.c. fault current in an a.c. electric circuit, wherein a load with a rectifier stage having a primary side has been connected up to an a.c. network and provides a direct current on a secondary side, and wherein the a.c. network has been fuse-protected with a fault-current circuit-breaker. The invention relates, moreover, to a device for detecting a d.c. fault current in an electric circuit, to a charger including such a device, and also to the use of this charger for charging an energy storage device of a vehicle.

The electric power networks in domestic installations or for current-collection points are ordinarily protected against overload with an overcurrent protective device and include, moreover, a fault-current protective device. The overcurrent protective device interrupts the flow of current if an overload of the circuit arises, for example as a result of a short circuit. In German households the circuits are ordinarily fuse-protected in such a way that the overcurrent protective devices trip in the case of a current above 16 amperes.

The fault-current protective devices, frequently realized as fault-current circuit-breakers, interrupt the flow of current if a differential current or a fault current arises in the circuit. Such a differential current or fault current arises if the current flowing towards the load in the circuit is not equal in magnitude to the current flowing back from the load. The cause of this may be a ground fault, in the case of which a portion of the current flows back from the load via the grounding or via a protective conductor. The fault currents constitute a danger, since they point to a defective insulation which represents a danger to life and limb upon contact.

Fault-current circuit-breakers in various embodiments are typically employed by way of fault-current protective devices. In this case, fault-current circuit-breakers of type AC can detect only purely sinusoidal fault currents, and can disconnect the power supply line from the voltage source in the case of a fault.

Fault-current circuit-breakers of type A can detect both purely sinusoidal fault currents and pulsating d.c. fault currents, and can disconnect the power supply line from the voltage source in the case of a fault. Fault-current circuit-breakers of this type, which cut out in the case of a fault current greater than 30 mA, are ordinarily employed in Germany for domestic installations. If a direct current having a current intensity greater than approximately 6 mA has been superimposed on the alternating current, fault-current circuit-breakers of types AC and A no longer trip at all.

Moreover, fault-current circuit-breakers of type B are known, which can detect any type of fault current and hence can trip also in the case of a pure d.c. fault current. However, an electronic unit is required for the monitoring for such d.c. fault currents, so fault-current circuit-breakers of type B require their own power supply. Such fault-current protective devices, also called universal-current-sensitive fault-current circuit-breakers, are known in the state of the art, for example from EP 0 866 536 A2.

A disadvantageous aspect of fault-current circuit-breakers of type B is that, in comparison with fault-current circuit-breakers of type A, they are costly to produce and therefore expensive.

SUMMARY OF THE INVENTION

A method is proposed for detecting a d.c. fault current in an a.c. electric circuit, wherein a rectifier unit having a primary side has been connected up to an a.c. network and provides a direct current on a secondary side. In this case, the a.c. network has been fuse-protected with a fault-current circuit-breaker which interrupts the circuit if an a.c. fault current greater than a specified a.c. tripping threshold arises. The method comprises the following steps:
  a) measuring a d.c. fault current in an a.c. circuit of the primary side,
  b) comparing the d.c. fault current with a specified d.c. tripping threshold and
  c) generating an a.c. fault current if the d.c. fault current lies above the tripping threshold, the current intensity of the a.c. fault current having been chosen so that it lies above the a.c. tripping threshold of the fault-current circuit-breaker.

In the course of the method, a rectifier unit is connected to an a.c. network. The a.c. network is, for example, a circuit of a domestic installation or an electrical installation for a current-collection point. The a.c. network is provided with protective devices which comprise an overcurrent protective device, to counter overload, and a fault-current circuit-breaker. Ordinarily employed by way of fault-current circuit-breaker is a fault-current circuit-breaker of type A, which can detect both sinusoidal a.c. fault currents and pulsating d.c. fault currents, or of type AC, which can detect only sinusoidal a.c. alternating fault currents—that is to say, only a.c. fault currents. In Germany, fault-current circuit-breakers of type A are ordinarily employed for fuse protection of domestic installations and current-collection points. These fault-current circuit-breakers interrupt the flow of current in the circuit if they detect an a.c. fault current that lies above a tripping threshold. With the interruption of the flow of current, the circuit is disconnected from the voltage source. In the case of a.c. fault currents, the tripping threshold is ordinarily about 30 mA, so the flow of current in the circuit is interrupted when an a.c. fault current ≥30 mA is present. In this case, in a.c. networks both the phase conductor and the neutral conductor are ordinarily interrupted. Only the protective conductor is excluded from the interruption.

In the second step b) of the method, the measured d.c. fault current is compared with a specified d.c. tripping threshold. This d.c. tripping threshold may have been firmly specified in the method or may have been designed to be adaptable, for example in order to be able to adapt the method to statutory requirements in various countries. The d.c. tripping threshold is, for example, between 2 mA and 6 mA, preferably between 5 and 6 mA.

If the measured d.c. fault current lies above the specified d.c. tripping threshold, then according to step c) of the method an a.c. fault current is generated, the current intensity of which has been chosen so that said fault current will trip the fault-current circuit-breaker in the a.c. network. In this way, it is ensured that the fault-current circuit-breaker of type A or of type AC, which by themselves cannot detect a d.c. fault current, trip also when a d.c. fault current is present. Through the limitation of the tripping threshold to a maximum of 6 mA, the situation is avoided where the magnetic circuit of fault-current circuit-breakers of types A and AC is driven into saturation and consequently can no longer detect a fault.

In one embodiment of the method, the a.c. fault current according to step c) of the method is generated by the additional connection of an electrical resistor on the primary side of the rectifier unit. The additional connection is preferably effected with the aid of an electrically operable switch, for example with the aid of a relay or with the aid of a semiconductor switch. Via the electrically operable switch and the electrical resistor, the non-grounded phase of the a.c. network or a first conductor in the case of ambiguous polarity is connected to the protective conductor and hence to the grounding. The electrical resistor in this case has been dimensioned so that the fault current generated in this way lies above the a.c. tripping threshold of the fault-current circuit-breaker. If the polarity of the a.c. network has been defined ambiguously, for example in the case of coupling via an ordinary receptacle outlet, a check can subsequently be made as to whether the circuit was successfully disconnected from the voltage source. If this is not the case, a second conductor can be connected to the protective conductor via an electrical resistor and an electrically operable switch. Subsequently it can be checked again whether the circuit was disconnected from the voltage source, in which connection an acoustic and/or visual warning message can occur if no disconnection of the voltage source was able to be achieved.

In a variant of the method, the direct current provided by the rectifier unit is used for charging an energy storage device, and an a.c. fault current is generated by way of disconnecting signal when the energy storage device has been fully charged. Such an energy storage device may be, for example, a battery or an accumulator or a capacitor. The energy storage device may in this case have been assigned, in particular, to an electrically driven vehicle such as, for example, a hybrid vehicle or an electric car.

This practical variant is suitable, in particular, for current-collection points that are located outside a building and are therefore accessible for everyone, in which case the fault-current circuit-breaker has preferably been placed at an inaccessible location. In this case, the current-collection point can be disconnected from the voltage source by the fault-current circuit-breaker after the energy storage device has been fully charged, so that unauthorized persons cannot use the current-collection point after completion of the charging process. Only after resetting of the fault-current circuit-breaker by an authorized user is a further charging process possible.

In a further embodiment of the method, the operational capability of the fault-current circuit-breaker is checked, by an a.c. fault current being generated. This may happen, in particular, upon explicit instruction of a user, for example via the provision of a test mode on the rectifier unit, or can always be triggered automatically by an energy storage device after completion of a charging process.

In one embodiment of the method, a malfunction of the fault-current circuit-breaker is inferred if the primary side of the rectifier unit is not disconnected from the voltage source after generation of the a.c. fault current. In this case, there may be provision that a signal is generated—for example, an acoustic or an optical signal—in order to inform the users of the rectifier unit of the malfunction of the fault-current circuit-breaker.

A further aspect of the invention relates to a device for detecting a d.c. fault current in an electric circuit. In this case, the device has preferably been designed or set up to implement the methods described herein. Accordingly, features described within the scope of the method apply correspondingly to the device, and conversely the features described within the scope of the device apply correspondingly to the method.

The device includes a measuring unit, for measuring a d.c. fault current, and also a tripping unit that has been set up to generate an a.c. fault current when a d.c. fault current is present that is greater than a specified d.c. tripping threshold.

A further aspect of the invention is to provide a charger for charging an energy storage device of a vehicle, said charger including one of the described devices for detecting a d.c. fault current.

Such a charger can be used, for example, for charging an energy storage device in the form of a battery or an accumulator that has been assigned to an electric vehicle or to a hybrid vehicle.

In one embodiment, the charger has been set up to generate an a.c. fault current when the energy storage device has been fully charged. For this purpose the charger can use the tripping unit of the device for detecting a d.c. fault current.

In a further embodiment, the charger includes, moreover, a compensating unit that has been set up to compensate a short-term d.c. fault current, by a further d.c. fault current having identical current intensity but having opposite current direction being generated. In this way, d.c. fault currents arising in the short term or for a single time can be eliminated or compensated without a disconnection having to occur immediately. As a result, the charging process is carried out more reliably.

With the method according to the invention and with the device according to the invention, a fault-current circuit-breaker of type A or of type AC, which has been provided anyway or which is already present in the domestic installation or in the installation of the current-collection point, is enabled to detect d.c. fault currents also. Advantageously, no changes whatsoever in the existing electrical installation are required for this. The device according to the invention and the method according to the invention are employed in connection with loads with rectifiers connected up to the existing electrical installation. Such rectifiers are employed, for example, as part of charging appliances for charging energy storage devices of electrically driven vehicles. In this case—in contrast to chargers for consumer electronics such as, for example, mobile phones or MP3 players—large direct currents are used, so comparatively large d.c. fault currents may occur even in cases of slight damage to the electrical insulation or as a result of faults in the so-called active rectifier stages. These d.c. fault currents not only constitute a source of danger in themselves but, under certain circumstances, can prevent fault-current circuit-breakers that are present in the electric power network from performing their protective action.

However, the retrofitting of the existing electric power networks with fault-current circuit-breakers of type B, which can trip both in the case of an a.c. fault current and in the case of a d.c. fault current, is advantageously no longer necessary in connection with the present invention, since the existing fault-current circuit-breakers of type A or type AC are enabled to trip also in the event of a pure d.c. fault current arising. For this purpose the invention provides that d.c. fault currents possibly arising on the primary side of a rectifier unit are detected, and in the event of a d.c. fault current being present an a.c. fault current is generated that is capable of tripping the fault-current circuit-breaker.

In comparison with the possibility of assigning a separate fault-current circuit-breaker of type B to the rectifier unit, the device according to the invention has been realized comparatively simply, since it does not need a separate appliance in order to interrupt the flow of current. The interruption of the flow of current is carried out by the fault-current circuit-breaker already present in the electric power network.

Furthermore, the orderly operation of the fault-current circuit-breaker is regularly checked through its utilization for disconnecting the receptacle outlet from the voltage source.

Furthermore, with loads equipped as intended any receptacle outlet can be used as energy-source without inadvertently endangering life and limb of other users who coincidentally and unknowingly use the same circuit.

BRIEF DESCRIPTION OF THE DRAWING

Exemplary embodiments of the invention are represented in the drawing and elucidated in more detail in the following description.

FIG. 1 shows a schematic representation of an exemplary charger with a device according to the invention.

The FIGURE represents the subject-matter of the invention only schematically.

DETAILED DESCRIPTION

FIG. 1 shows a charger 12 which has been set up to charge an energy storage device 42 of a vehicle 40. The charger 12 has been connected for this purpose to an a.c. network 34 which has been connected up to the public electric power network 32 via a fuse box 30. The a.c. network 34 may be a circuit of a domestic electric power network. Accommodated in the fuse box 30 by way of protective devices are an overcurrent protective device 36 and a fault-current circuit-breaker 38.

The overcurrent protective device 36 has been set up to interrupt the flow of current in the a.c. network 34 if the flow of current in the a.c. network 34 exceeds the permissible value. In Germany, the individual circuits of the a.c. network 34 in the case of a circuit of a domestic electric power network are ordinarily fuse-protected at 16 amperes that is to say, in this case the overcurrent protective device 36 would trip if the flow of current in the a.c. network 34 exceeds 16 amperes. The fault-current circuit-breaker 38 has been realized, for example, as a fault-current circuit-breaker of type A, such as is ordinarily used in Germany for domestic installations. The fault-current circuit-breaker 38 detects sinusoidal fault currents—that is to say, a.c. fault currents and also pulsed d.c. fault currents. If a fault current, in particular an a.c. fault current, having a current intensity that lies above the a.c. tripping threshold is ascertained, the fault-current circuit-breaker 38 disconnects the a.c. network 34 from the voltage source. In the case of the fault-current circuit-breakers ordinarily employed, the a.c. tripping threshold is about 30 mA. In this case, both the neutral conductor and the phase conductor are isolated. The protective conductor or ground conductor is not isolated in this case.

Both the overcurrent protective device 36 and the fault-current circuit-breaker 38 have been set up in this case in such a way that they can be reset or switched on again by a user after elimination of the fault.

The charger 12 includes a rectifier unit 14 which has a primary side 13 and a secondary side 15. The rectifier unit 14 has been connected by its primary side 13 to the a.c. network 34, and in the situation represented in FIG. 1 the secondary side 15 has been connected to the energy storage device 42 of the vehicle 40 via a charging cable 44.

Moreover, on the primary side 13 of the rectifier unit 14 a measuring unit 16 is located which has been set up to ascertain a d.c. fault current. For this purpose the measuring unit 16 measures the current intensity of the d.c. component of the flowing alternating current on the primary side 13 of the rectifier unit 14. Since the alternating current does not normally have a d.c. component, in the case where a d.c. component is present the presence of an fault can be inferred.

The measuring unit 16 compares the measured d.c. fault current with a specified d.c. tripping threshold. If the measured d.c. fault current is greater than or equal to the d.c. tripping threshold, a tripping unit 18 is activated by the measuring unit 16. For this purpose the tripping unit 18 has been connected to the measuring unit 16 via a line 19. The d.c. tripping threshold is, for example, 6 mA.

In the embodiment represented, the tripping unit 18 includes two electrically operable switches 20 and 20' as well as an ohmic resistor 22. The tripping unit 18 has been connected on one side to one of the current-carrying conductors of the a.c. network 34, and on the other side to a protective conductor 35. Since commercially available plug-in appliances can be plugged in without preferential direction, the tripping unit 18 has been constructed with two poles, so that the two electrically operable switches 20, 20' can be switched in succession for the purpose of generating a tripping fault current. If, on the other hand, the polarity has been predetermined unambiguously, a single electrically operable switch 20, which has been connected to the conductor, designated as the phase, of the a.c. network 34, is sufficient.

If the tripping unit 18 is activated, the electrically operable switch 20 is closed, so that current flows from the a.c. network 34 into the protective conductor 35 via the resistor 22. In this case, the resistor 22 has been dimensioned, by its size, in such a way that the alternating current flowing after the electrically operable switch 20 has been closed, which constitutes an a.c. fault current, is greater than the a.c. tripping threshold of the fault-current circuit-breaker 38. In the case of a voltage of 230 V in the a.c. network 34, the resistance 22 amounts to, for example, 6 kΩ, in order to generate an a.c. fault current of about 38 mA. If no a.c. fault current is detected by the measuring unit 16 after the actuation of switch 20, the latter is opened again and the other switch 20' is closed.

The tripping unit 18 and the measuring unit 16 together constitute the device 10 for detecting a d.c. fault current. Through the provision of this device 10, the fault-current circuit-breaker 38, which on its own cannot detect a d.c. fault current, is enabled to trip in the event of a d.c. fault current arising on the primary side 13 of the rectifier unit 14. Consequently a comprehensive protection against fault currents is achieved even without an exchange of the fault-current circuit-breaker 38 for a so-called universal-current-sensitive fault-current circuit-breaker, or fault-current circuit-breaker of type B.

Besides the described exemplary use of the device 10 with a charger 12, in further embodiments a use of the device 10 in connection with other appliances or machines that operate with switched rectifiers or with d.c. intermediate circuits is also conceivable. This includes, for example, appliances and machines having so-called frequency-inverter controllers, such as washing machines and elevators, as well as all electrical loads that generate direct current from alternating current and that do not exhibit a suitable primary-side galvanic isolation.

The invention is not restricted to the exemplary embodiments described herein and to the aspects emphasized therein. Rather, within the range specified by the claims a large number of modifications are possible which lie within the scope of expert activity.

The invention claimed is:

1. A method for detecting a direct current fault current in an alternating current electric circuit, wherein a rectifier unit (14) having a primary side (13) is connected to an alternating current network (34) and provides a direct current on a secondary side (15), and wherein the alternating current network (34) is fuse-protected with a fault-current circuit-breaker (38) which interrupts the circuit if an alternating current fault current greater than a specified alternating current tripping threshold arises, comprising the following steps:
   a) measuring a direct current fault current on the primary side (13),
   b) comparing the direct current fault current with a specified direct current tripping threshold and
   c) generating an alternating current fault current if the direct current fault current lies above the tripping threshold, the current intensity of the alternating current fault current having been chosen so that it lies above the alternating current tripping threshold of the fault-current circuit-breaker,
wherin the direct current is used as charging current for charging an energy storage device (42), and an alternating current fault current is generated when the energy storage device (42) has been fully charged.

2. The method as claimed in claim 1, characterized in that the alternating current fault current according to step c) is generated by the additional connection of a resistor (22) on the primary side (13).

3. The method as claimed in claim 1, characterized in that an alternating current fault current is generated for the purpose of checking the operational capability of the fault-current circuit-breaker (38).

4. The method as claimed in claim 1, characterized in that a malfunction of the fault-current circuit-breaker (38) is inferred if the primary side (13) is not disconnected from the voltage source after generation of the alternating current fault current.

5. A charger (12) for charging an energy storage device (42) of a vehicle (40), including a device (10) for detecting a direct current fault current in an electric circuit, including a measuring unit (16) for measuring a direct current fault current, characterized in that the device (10) includes a tripping unit (18) which has been set up to generate an alternating current fault current in the presence of a direct current fault current that is greater than a specified direct current tripping threshold, wherein the charger (12) is configured to generate an alternating current fault current when the energy storage device (42) has been fully charged.

6. The charger (12) as claimed in claim 5, characterized in that the charger (12) includes a compensating device which is configured to compensate a direct current fault current by generating a further direct current fault current having identical current intensity but having opposite current direction.

7. The charger (12) as claimed in claim 5 wherein the charger (12) charges an energy storage device (42) of a vehicle (40).

* * * * *